(12) United States Patent
Edwards

(10) Patent No.: US 6,538,776 B2
(45) Date of Patent: Mar. 25, 2003

(54) SELF-REFERENCED HOLOGRAPHIC STORAGE

(75) Inventor: Jathan D. Edwards, Afton, MN (US)

(73) Assignee: Imation Corp., Oakdale, MN (US)

( * ) Notice: Subject to any disclaimer, the term of this patent is extended or adjusted under 35 U.S.C. 154(b) by 14 days.

(21) Appl. No.: 09/813,066

(22) Filed: Mar. 20, 2001

(65) Prior Publication Data

US 2002/0135832 A1 Sep. 26, 2002

(51) Int. Cl.[7] .................................................. G03H 1/16
(52) U.S. Cl. ............................ 359/29; 359/1; 359/22; 359/35
(58) Field of Search ......................... 359/1, 22, 29, 359/35

(56) References Cited

U.S. PATENT DOCUMENTS

| | | | |
|---|---|---|---|
| 4,104,489 A | * 8/1978 | Satoh et al. | 359/29 |
| 5,307,184 A | * 4/1994 | Nishikawi et al. | 359/35 |
| 5,719,691 A | 2/1998 | Curtis et al. | |
| 5,812,288 A | 9/1998 | Curtis et al. | |
| 5,838,650 A | 11/1998 | Campbell et al. | |
| 5,874,187 A | 2/1999 | Colvin et al. | |

OTHER PUBLICATIONS

Psaltis et al., "Holographic storage using shift multiplexing," Optics Letters, vol. 20, No. 7, Apr. 1, 1995, pp. 782–784.
Pu et al., "High–density recording in photopolymer–based holographic three–dimensional disks," Applied Optics, vol. 35, No. 14, May 1996, pp. 2389–2398.
Barbastathis et al., "Shift multiplexing with spherical reference waves," Applied Optics, vol. 35, No. 14, May 1996, pp. 2403–2417.
Psaltis et al., "Holographic Data Storage," Computer IEEE, Feb. 1998, pp. 52–60.
Dhar et al., "Holographic storage of multiple high–capacity digital data pages in thick photopolymer system," Optics Letters, vol. 23, No. 21, Nov. 1, 1988, pp. 1710–1712.
Curtis et al., "High Density, High Performance Data Storage via Volume Holography: The Lucent Technologies Hardware Platform," Bell Laboratories, Lucent Technologies, pp. 1–9, published in 2000 by Holographic Data Storage, Ed. Coufal et al.
Ashley et al., "Holographic data storage," IBM J. Res. Develop, vol., 44, No. 3, May 3, 2000, pp. 341–368.

* cited by examiner

Primary Examiner—Andrey Chang
Assistant Examiner—Craig Curtis
(74) Attorney, Agent, or Firm—Eric D. Levinson

(57) ABSTRACT

The invention presents the concept of self-referenced holographic data recording. In exemplary embodiments, the invention comprises methods of recording holograms on holographic data storage media; media produced by such methods; and self-referencing holographic data storage systems. A method of recording data in a holographic recording medium may comprise illuminating a medium with a data encoded first optical beam, optically directing a zero frequency Fourier component of the first optical beam to create a second optical beam, and illuminating the medium with the second optical. In some embodiments, for example, a self-referencing holographic data storage system has a single optical path directed towards a medium.

23 Claims, 15 Drawing Sheets

FIGURES
5A-5C

SELF-REFERENCED HOLOGRAPHIC STORAGE

This invention was made with Government support under Agreement No. NMA202-97-9-1050with the National Imagery and Mapping Agency of the United States Department of Defense. The Government has certain rights in this invention.

FIELD

The present invention relates to holographic data storage.

BACKGROUND

Many different types of data storage media have been developed to store information. Traditional media, for instance, include magnetic media, optical media, and mechanical media to name a few. Increasing data storage density is a paramount goal in the development of new or improved types of data storage media.

In traditional media, individual bits are stored as distinct mechanical, optical, or magnetic changes on the surface of the media. For this reason, medium surface area may pose physical limits on data densities.

Holographic data storage media can offer higher storage densities than traditional media. In a holographic medium, data is stored throughout the volume of the medium rather than the medium surface. Moreover, data can be superimposed within the same medium volume through a process called shift multiplexing. For these reasons, theoretical holographic storage densities can approach tens of terabits per cubic centimeter.

In holographic data storage media, entire pages of information can be stored as optical interference patterns within a photosensitive optical material. This can be done by intersecting two coherent laser beams within the optical material. The first laser beam, called the object beam, contains the information to be stored; and the second, called the reference beam, interferes with the object beam to create an interference pattern that can be stored in the optical material as a hologram. The object beam and reference beam ordinarily follow separate optical paths.

When the stored hologram is later illuminated with only the reference beam, some of the reference beam light is diffracted by the hologram interference pattern. Moreover, the diffracted light creates a reconstruction of the original object beam. Thus, by illuminating a recorded hologram with the reference beam, the data encoded in the object beam can be reconstructed and detected by a data detector such as a camera.

In addition to the high data densities that can be achieved in holographic data storage media, holographic data storage media also present other potential advantages over more traditional media. For instance, because laser beams are used to detect the data, the use of mechanical components may be minimized. Moreover, eliminating mechanical components can increase data access times. Thus, holographic data storage systems can have access times as fast as 10 $\mu$s.

Nevertheless, even though holographic data storage media present attractive data storage density capabilities and fast access times, creating a marketable product has proven difficult. Among other things, the relatively high cost of system components, and system configuration constraints have undermined the ability to create holographic data storage systems that can compete in the market with existing data storage technologies.

SUMMARY OF THE INVENTION

The invention presents the concepts of self-referenced holographic data recording. In exemplary embodiments, the invention comprises methods of recording holograms on holographic data storage media; media produced by such methods; and self-referencing holographic data storage system has a single optical path directed towards a holographic recording medium.

In one exemplary embodiment, a method of recording data in a holographic recording medium comprises illuminating the medium with a data encoded first optical beam, optically directing a zero frequency Fourier component of the first optical beam to create a second optical beam, and illuminating the medium with the second optical beam. For example, the medium can be placed in proximity to a Fourier transform plane of the optical system. Then, while illuminating the medium with a first optical beam, the Fourier component of the first optical beam can be directed to create the second optical beam which may comprise a holographic reference beam.

The first optical beam and the second optical beam may follow the same optical path. For instance, the path of the reference beam may be coaxial with the path of the of the object beam. In other embodiments, the invention comprises holographic data storage media recorded using these methods.

Optically directing the zero frequency Fourier component of the first optical beam may comprise positioning a mirror after a media plane to reflect the zero frequency Fourier component of the first optical beam. Alternatively, optically directing the zero frequency Fourier component of the first optical beam may comprise positioning a lens before the media plane to refract the zero frequency Fourier component of the first optical beam. If a mirror is used to optically direct the zero frequency Fourier component of the first optical beam, the mirror may be a flat mirror positioned at the center of a Fourier plane. Alternatively, the mirror may be a concave mirror positioned a distance beyond a Fourier plane, or a convex mirror positioned a distance before a Fourier plane.

In still other embodiments, the invention comprises a holographic data storage system. The system may include a laser that produces laser light and a collection of optical elements. The optical elements may create an object beam and a reference beam from the laser light and the reference beam may be created from a zero frequency Fourier component of the object beam. The system may include a data encoder for encoding data in the object beam and the system may also include a holographic medium. Moreover, the holographic medium may contain a hologram created by the interference of the reference beam and object beam. The system may further include a data detector for detecting data in the reconstructed hologram when the reference beam illuminates the medium.

In the system, the data encoder may be a spatial light modulator, and the data detector may be a camera. The hologram may be generated from an object beam constructed of a pixel array that is a data encoded bit map. The collection of optical elements may define an optical path, and the object beam and reference beam may both follow the common path of optical elements. In some embodiments, the common optical path is the only optical path in the system.

Additional details of these and other embodiments are set forth in the accompanying drawings and the description below. Other features, objects and advantages will become apparent from the description and drawings, and from the claims.

DESCRIPTION

Figure 1:
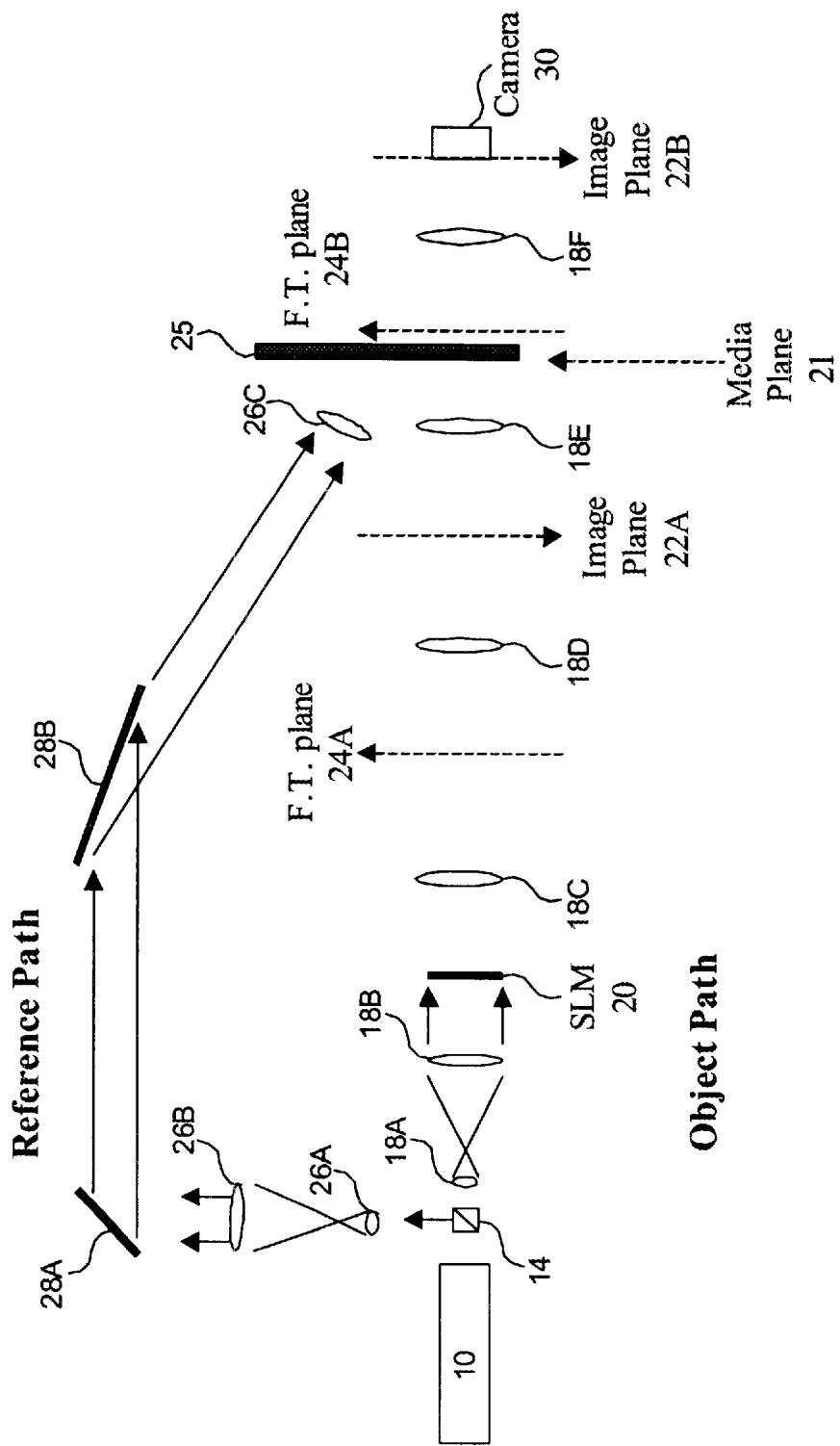
FIG. 1 illustrates a conventional optical arrangement for holographic recording.

FIG. 1 illustrates a conventional optical arrangement for holographic recording. As shown in FIG. 1, laser 10 produces laser light that is divided into two components by beam splitter 14. These two components generally have an approximately equal intensity and may be spatially filtered to eliminate any optical wave front errors.

The first component exits beam splitter 14 and follows an object path. This "object beam" may then pass through a collection of object beam optical elements 18A–18E and a data encoder such as a Spatial Light Modulator (SLM) 20. For instance, lens 18A may expand the laser light and lens 18B may condition the laser light so that the photons are traveling substantially parallel when they enter SLM 20.

Figure 2:
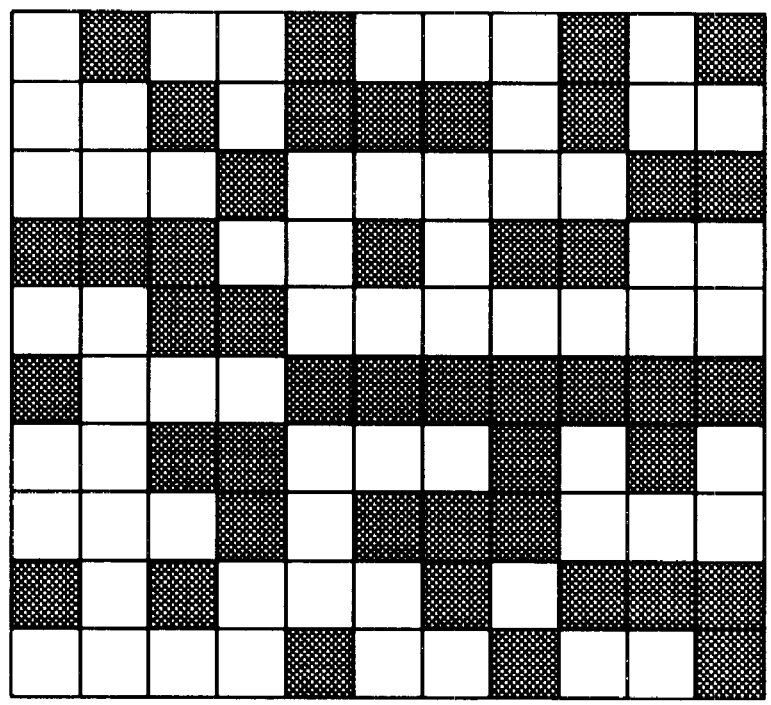
FIG. 2 illustrates an exemplary 10 by 10 bit pixel array.

SLM 20 may encode data in the object beam, for instance, in the form of a holographic bit map (or pixel array). FIG. 2, for instance, shows an enlarged view of an exemplary 10 by 10 bit pixel array. The encoded object beam may pass through lenses 18C, 18D, and 18E before illuminating a holographic recording media plane 21. In this conventional "4F" configuration, lens 18C is located one focal length from SLM 20 and one focal length from Fourier transform plane 24A. Lens 18D is located one focal length from Fourier transform plane 24A and one focal length from image plane 22A. Lens 18E is located one focal length from image plane 22A and one focal length from Fourier transform plane 24B.

The second component exits the beam splitter 14 and follows a reference path that is different from the object path. This "reference beam" may be directed by reference beam optical elements such as lenses 26A–26C and mirrors 28A–28B. The reference beam illuminates the media holographic recording plane 21, interfering with the object beam to create a hologram on medium 25.

By way of example, medium 25 may take the form of a disk or a card, although the scope of the invention is not limited in that respect. The disk, for instance, may have a sandwich construction in which a photosensitive material is sandwiched between two substrate portions. The hologram generated from an object beam constructed of a pixel array that is a data encoded bit map like that shown in FIG. 2 may be stored in the photosensitive material. The photosensitive material, for instance, may be a photopolymer and the substrate portions may be comprised of polymer materials.

When recording a hologram, storage medium 25 is typically located at or near one of the Fourier transform planes. Using this system, the data encoded in the object beam by SLM 20 is recorded in medium 25 by simultaneously illuminating both the object and the reference paths.

After a hologram has been stored on the medium 25, the data encoded in the hologram may be read by the system. For readout of the data, only the reference beam is allowed to illuminate the hologram on medium 25. Light diffracts off the hologram stored on medium 25 to reconstruct or "recreate" the object beam, or a beam of light that is substantially equivalent to the original encoded object beam. This reconstructed object beam passes through lens 18F permitting a reconstruction of the bit map that was encoded in the object beam to be observed at image plane 22B. Therefore, a data detector, such as camera 30 can be positioned at image plane 22B to read the data encoded in the hologram.

The holographic bit map encoded by SLM 20 comprises one "page" of holographic data. For instance, the page may be an array of binary information that is stored in a particular location on the holographic medium as a hologram. By way of example, a typical page of holographic data may be 1000 bit by 1000 bit pixel array that is stored in a few square millimeters of medium surface area, although the scope of the invention is not limited in that respect.

There are several complexities that make the optical arrangement illustrated in FIG. 1 difficult to implement in a commercially viable system. For instance, to record a suitable hologram, the two separate optical paths must maintain both precise relative angular registration and precise overlap in the media plane. Moreover, the requirement of two separate optical paths may impose size constraints for a holographic recording system. In addition, separate optical paths for the object and reference beams may mandate the use of additional optical elements 26A–26C, 28A–28B. Lenses 26A–26C, for instance, may add substantial cost to the system. For this reason, it may be advantageous to limit the number of lenses in the system.

Another complication with the system illustrated in FIG. 1 is the requirement that elements such as camera 30 reside on the transmission side of medium 25, i.e., the non-recording side. This amount of optical access to both sides of the medium 25 can provide substantial limitations in system configuration. For instance, the arrangement of FIG. 1 may require a precarious mechanical cantilever to allow optical access to both sides of the medium.

Figure 3:
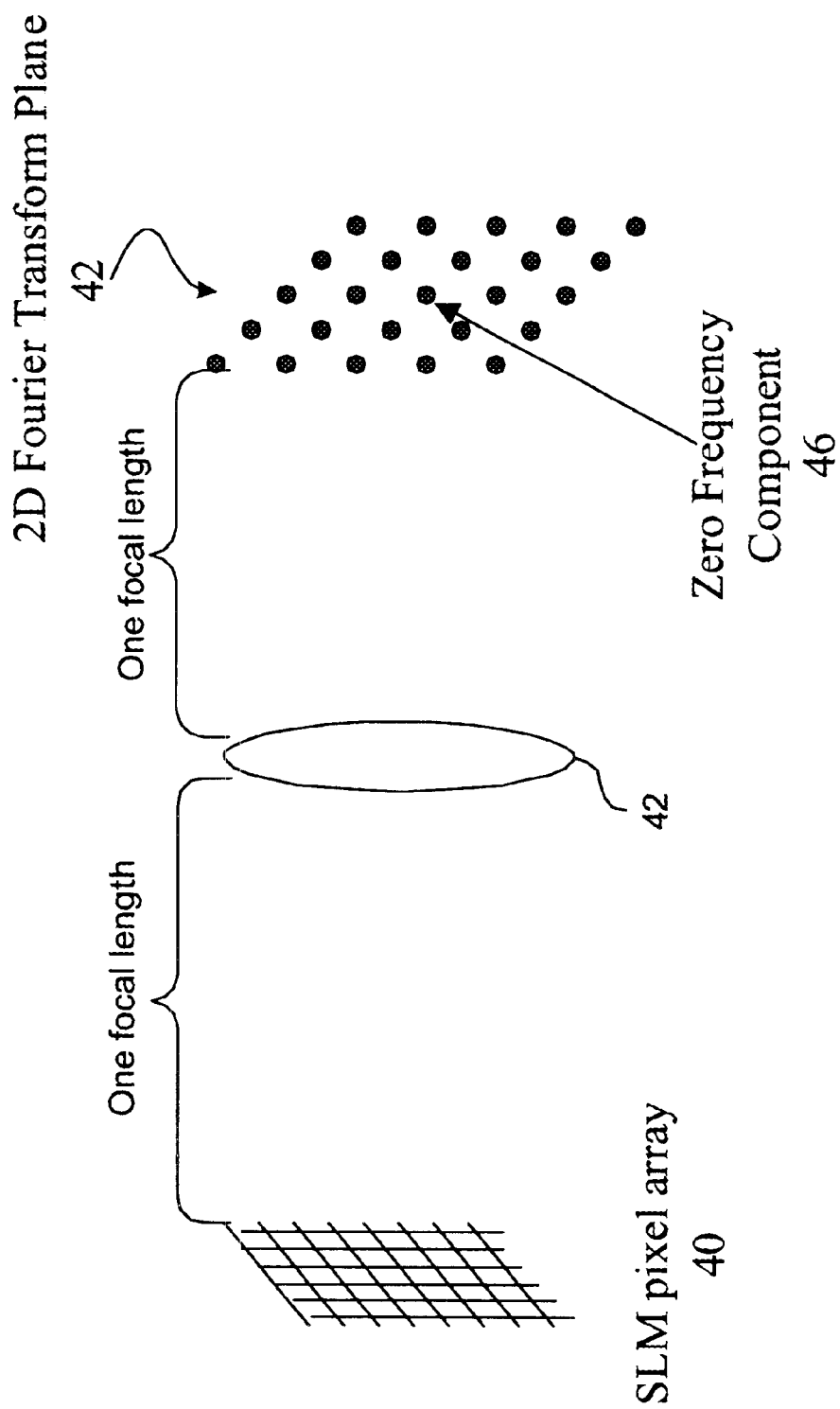
FIG. 3 is used to illustrate Fourier decomposition.

In exemplary embodiments, the invention comprises self-reference holographic data storage. To understand how self-referenced holographic recording operates requires a basic understanding of Fourier decomposition. FIG. 3 is used to help illustrate Fourier decomposition. As shown in FIG. 3, an exemplary SLM pixel array 40 can be used to encode data on an object beam. After passing through the SLM pixel array 40, the object beam may then pass through a lens 42 located one focal length from the SLM pixel array 40. At a distance of one additional focal length from the lens 42, the object beam appears as a collection of Fourier components in a Fourier transform plane 44.

The Fourier components contain all of the information of the SLM pixel array. However, all of the data is contained in the "higher order components" of the Fourier spectrum. The zero-frequency (or DC) component 46 that resides in the center of the Fourier spectrum is not a higher order component, and it does not contain any of the encoded data. Rather, the zero frequency Fourier component contains only information defining the average intensity of the light incident on the SLM object image. Moreover, this zero frequency Fourier component typically contains a significant fraction of the total amount of light in the Fourier spectrum.

In accordance with an embodiment of the invention, a reference beam can be created from the zero frequency component of the Fourier spectrum. This can be done by optically directing the zero frequency component of the Fourier spectrum through the same volume of recording material as that illuminated by the higher order Fourier components. For instance, by positioning a mirror after the media plane, the zero frequency Fourier component can be optically directed by optical reflection. Alternatively, by positioning a lens between the medium and the SLM, the zero frequency Fourier component can be optically directed by optical refraction.

Using the zero frequency component of the Fourier spectrum as a reference beam may solve many of the problems that have limited the ability to bring holographic data storage systems to market. For instance, if the zero frequency component of the Fourier spectrum is used to produce the reference beam, the system may have only one optical path directed towards the medium. Moreover, the number of optical elements needed by the system, such as high quality (expensive) lenses may be reduced. A second path of optical elements may no longer be needed to record holograms, and the size of the system may be reduced significantly. In addition, in some embodiments, where the zero frequency Fourier component is optically directed by optical reflection, both the camera and the SLM may be positioned on the same side of the medium. Positioning the SLM and camera on the same side of the medium simplifies medium access and permits a more compact medium handing mechanism.

Figure 4:
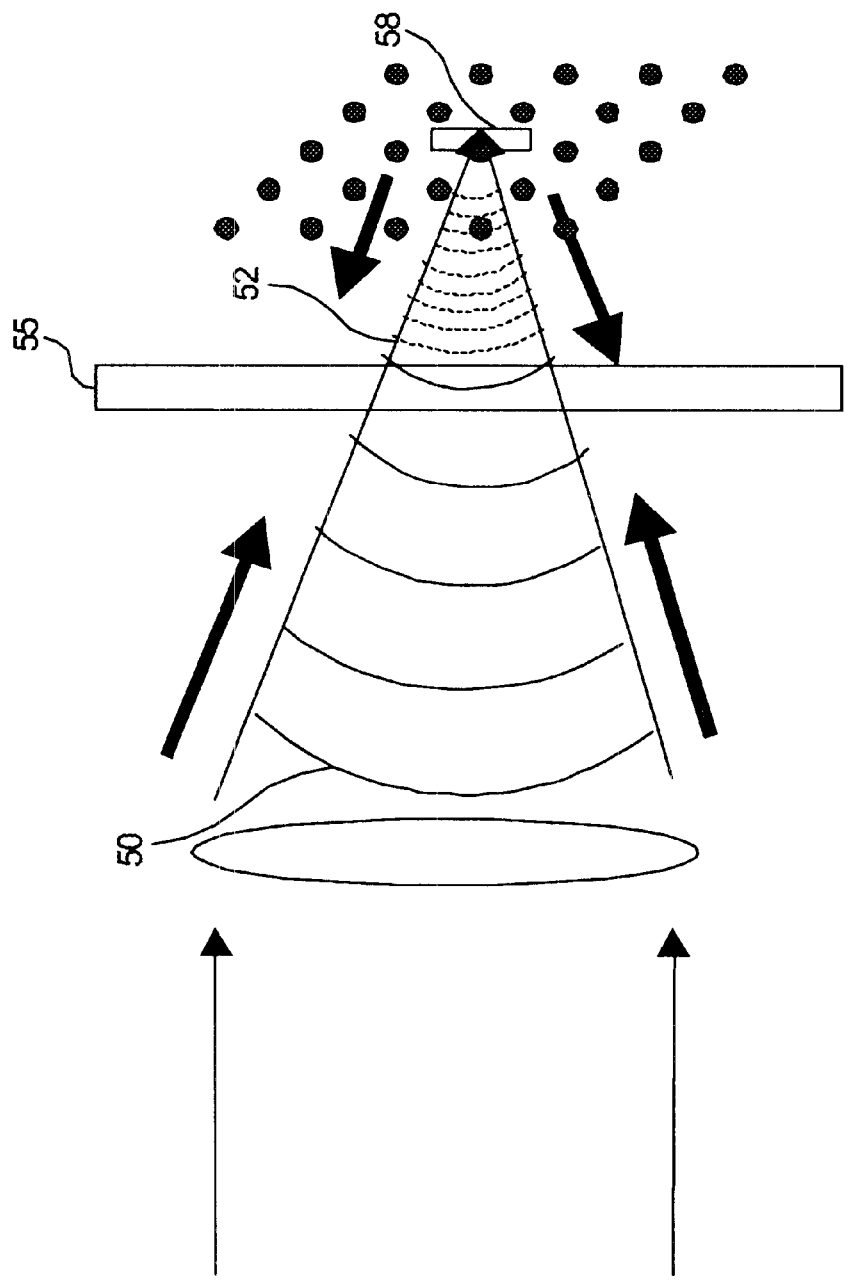
FIGS. 4, 5A–5C and FIG. 6 illustrate different exemplary embodiments of optical arrangements for self-referenced holographic recording.

FIG. 4 illustrates an exemplary embodiment of self-referencing holographic recording. An object beam 50 interrogates through medium 55. A flat mirror 58, for instance, can be placed directly in the Fourier transform plane to reflect the zero frequency Fourier component of object beam. This reflected zero frequency Fourier component then becomes a reference beam 52 that overlaps and interferes with the object beam to record a hologram on medium 55.

Figure 5:
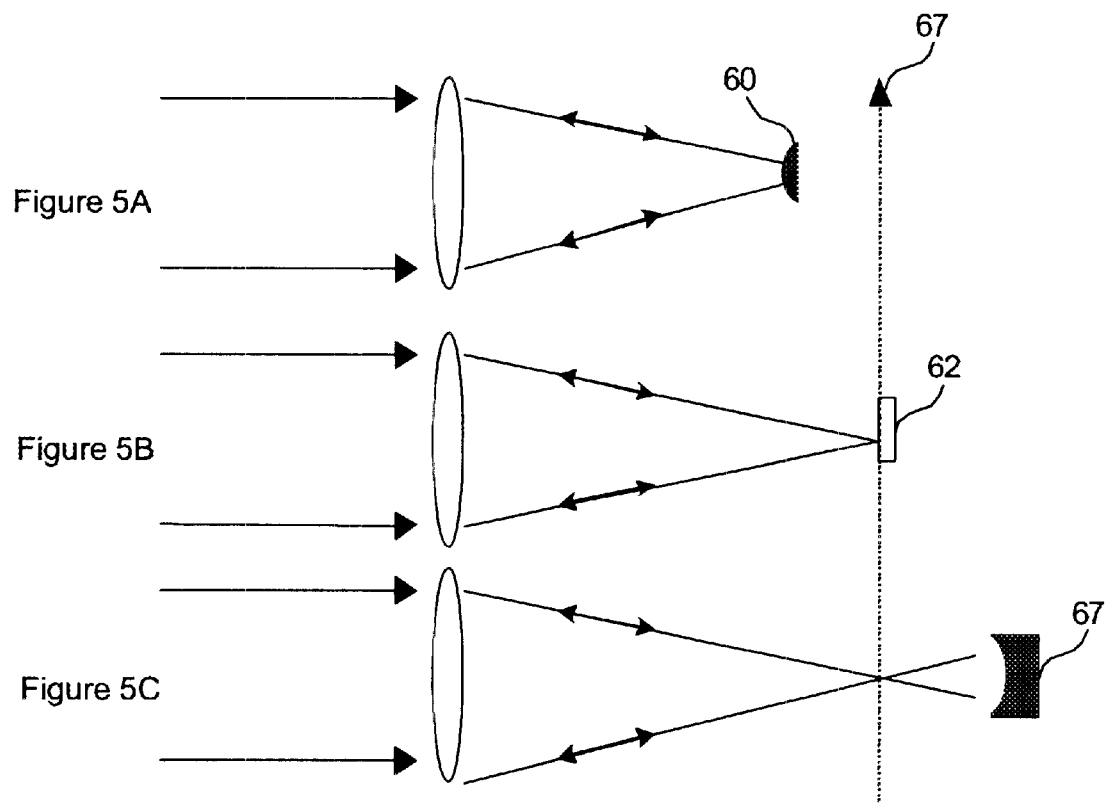
Figure 6:
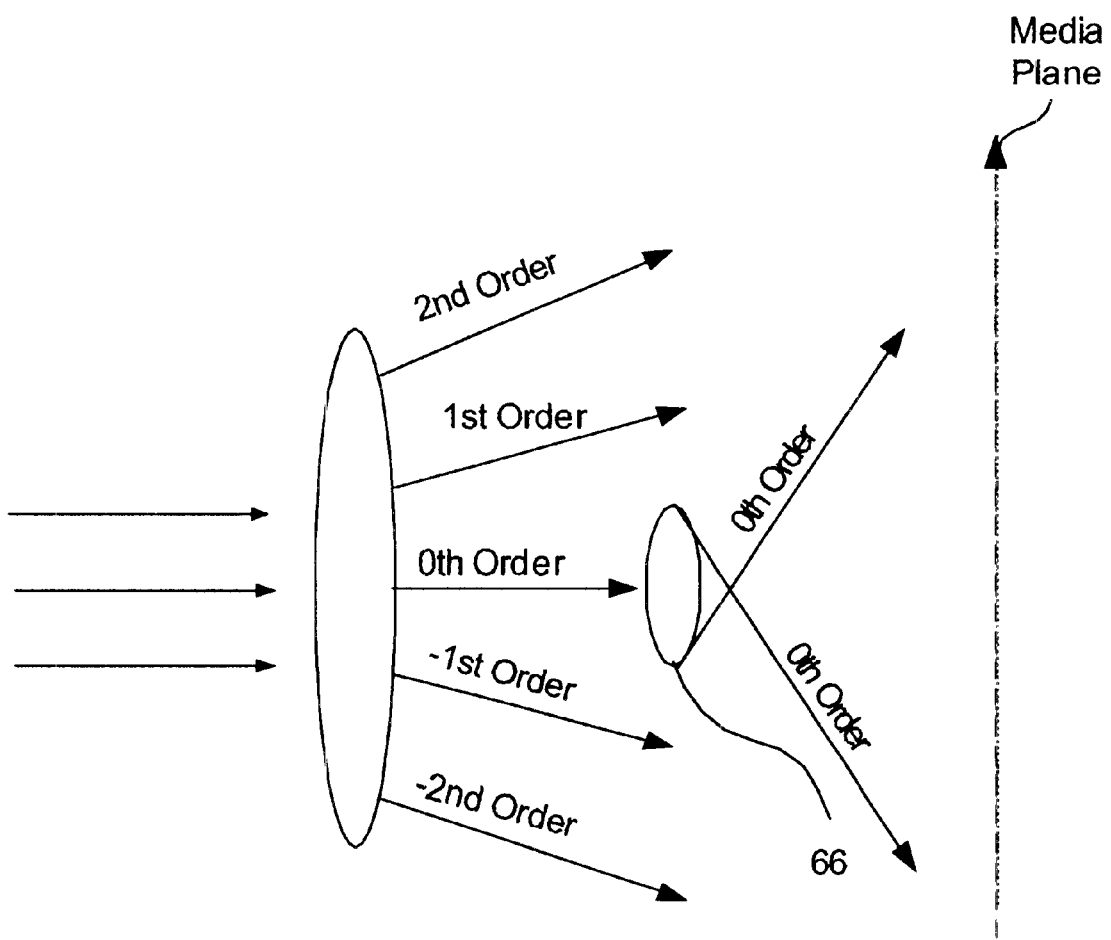

FIGS. 5A–5C and FIG. 6 illustrate four different exemplary embodiments of self-referencing holographic recording. For instance, FIGS. 5A–5C and FIG. 6 illustrate different embodiments for optically directing the zero frequency Fourier component of an object beam to create a reference beam. FIGS. 5A–5C implement reflection techniques and FIG. 6 implements a refraction technique. In FIG. 5A, a convex mirror 60 is positioned before the Fourier plane 67 to optically direct the zero frequency Fourier component of an object beam. In FIG. 5B, a flat mirror 62 is positioned in the Fourier plane 67 to optically direct the zero frequency Fourier component of an object beam. And in FIG. 5C, a concave mirror 64 is positioned after the Fourier plane 67 to optically direct the zero frequency Fourier component of an object beam. In FIG. 6, a lens 66 is positioned before the media plane to optically direct the zero frequency Fourier component of an object beam.

One potential drawback to self-referencing holographic recording is the loss of independent control of the relative intensities of the object and reference beams. Ideally, object and reference beams should have relatively equal intensities. In a traditional dual path system, a beam splitter could be positioned to ensure that the intensities of the different beams were approximately equal. However, in self-referenced holographic recording, the intensity of the reference beam is dependent on the zero frequency Fourier component of the object beam, which is related to intensity.

The embodiment shown in FIG. 6 may be useful to achieve relatively equal intensities. As stated above, the zero frequency Fourier component of the object beam may comprise a significant portion of the object beam's intensity. In the embodiment in FIG. 6, however, the zero frequency Fourier component is removed from the object beam to create the reference beam before the two beams interfere in the media plane. For this reason, the embodiment in FIG. 6 may illustrate an optical arrangement for a self-referenced holographic recording system that achieves approximately equal object beam and reference beam intensities.

Although the embodiments in FIGS. 5A–5C may not maximize the ability to achieve substantially equal relative intensities between the object and reference beams, the embodiments in FIGS. 5A–5C are highly advantageous for a different reason. The embodiments in FIGS. 5A–5C may allow a data detector to be positioned on the same side as the laser, SLM and other optical elements. To understand why, requires a brief description of phase-conjugate optical physics.

Figure 7A:
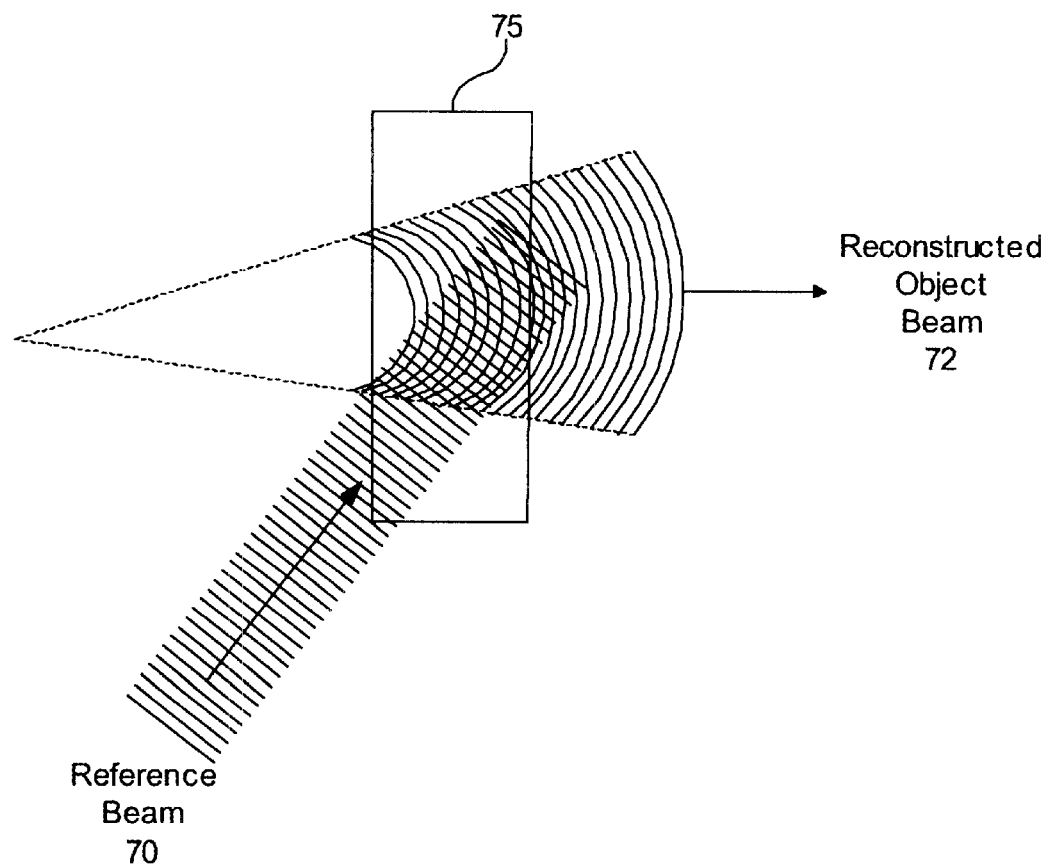
FIG. 7A illustrates how an object beam may be reconstructed when a hologram is illuminated with a reference beam.

As described above, to record a hologram, an object beam and reference beam are typically made to interfere on the same side of a medium 75 to create a hologram. As shown in FIG. 7A, when the reference beam 70 illuminates the recorded hologram on medium 75, refracted light reconstructs the original object beam 72. The side of the medium from which the recording beams originate is referred to as the incident side, and the opposite side of the medium is referred to as the transmission side.

Figure 7B:
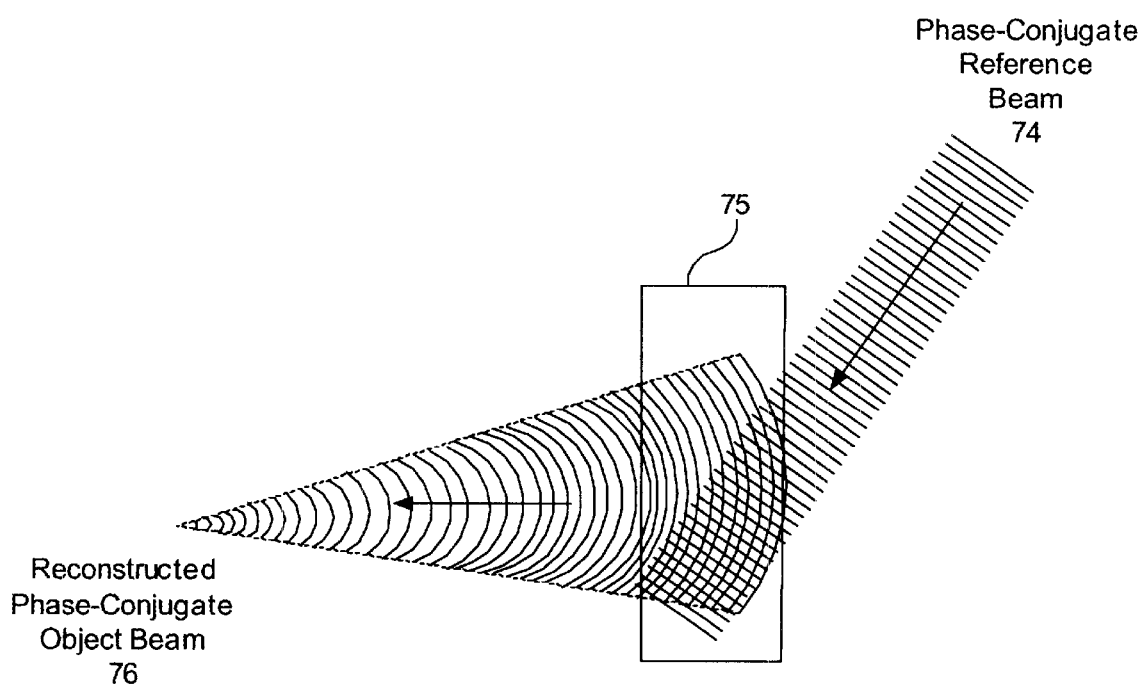
FIG. 7B illustrates how the phase-conjugate of an object beam may be reconstructed when a hologram is illuminated with the phase-conjugate of the reference beam.

FIG. 7B illustrates a phase-conjugate reference beam 74. The phase-conjugate reference beam 74, for instance, is generally a reference beam propagating in a direction that is 180 degrees different from the original reference beam 70. When phase-conjugate reference beam 74 illuminates the recorded hologram on medium 75, diffracted light is the phase-conjugate of the original object beam, e.g., reconstructed phase-conjugate object beam 76. Reconstructed phase-conjugate object beam 76 is generally a beam propagating in a direction that is 180 degrees different from the original object beam 70.

Thus, once a hologram has been recorded, the phase-conjugate of the reference beam may be used to illuminate the hologram from the transmission side of medium 75. In this case, the resultant beam that is diffracted is a reconstruction of the phase-conjugate of the object beam, and it propagates back towards the source of the original object beam.

Referring again to FIGS. 5A–5C, during recording, the reference beam is reflected 180 degrees to propagate back to the backside of the medium. Therefore, the phase-conjugate of the reference beam in FIGS. 5A–5C is simply a non-reflected forward propagating zero frequency Fourier component of the object beam. For this reason, the embodiments of FIGS. 5A–5C may take advantage of phase-conjugate optical physics to realize a system where both the SLM and the camera reside on the same side of the medium. This greatly simplifies the optical access to the medium and permits a more compact medium handing mechanism.

Figure 8:
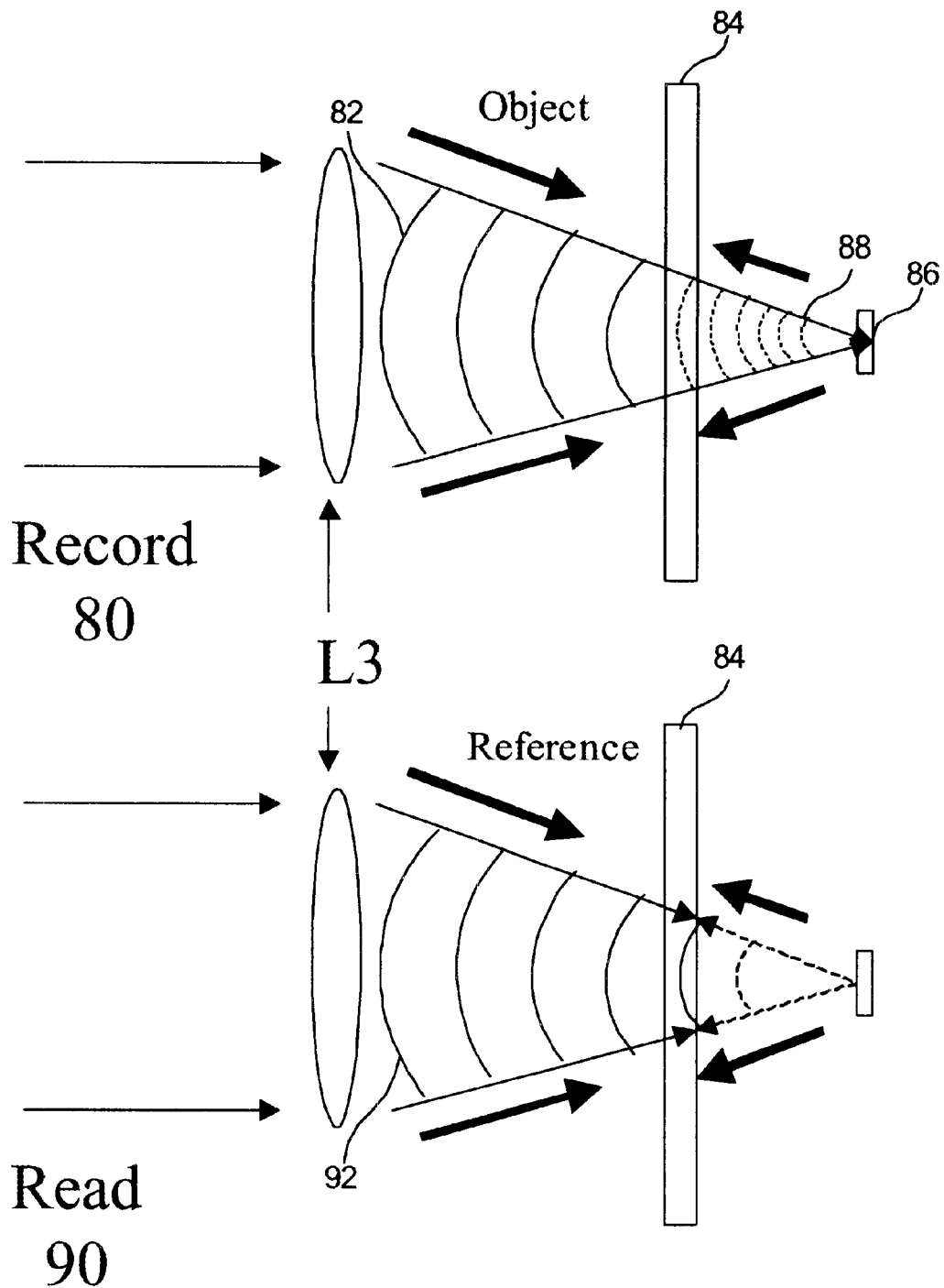
FIG. 8 illustrates an exemplary embodiment of self-referenced holographic recording implementing a phase-conjugate reading technique.

As shown in FIG. 8, during a record phase 80 an object beam 82 illuminates recording medium 84 and the zero frequency Fourier component of the object beam is reflected by mirror 86, creating a reference beam 88 that interferes with the object beam 82 at the media plane. In this manner, a hologram is created on medium 84, and the hologram may contain data encoded in the object beam 82.

Then, during a read phase 90, the phase-conjugate of the reference beam 92 illuminates medium 84 from the same side that the object beam 82 illuminated the medium during the record phase 80. The phase-conjugate of the reference beam 92, however, is simply the incident side zero frequency Fourier component of the object beam 82. Thus, the reconstructed object beam is diffracted out of the incident side of the medium, and a camera may be positioned on the same side as the SLM, laser, and other optical elements that create the object beam. A lens or mirror (not shown) may be used to inverse transform the phase-conjugate object beam to reconstruct the original object beam on the record side of the medium 84 where it can be read by a data detector such as a camera.

Using both a self-referencing recording technique and a phase-conjugate reading technique, a holographic data storage system may overcome many of the problems that traditionally have limited the commercial success of holographic data recording systems. The self-referencing allows the system to be realized with a single optical path, may reduce the number of optical elements needed in the system, and may overcome traditional system size constraints. Then, by implementing a phase-conjugate reading technique, substantially single-sided optical access to the recording media can be achieved to overcome traditional system alignment problems and other system size limitations. Moreover, the phase-conjugate of the reference beam of a self-referenced hologram created by reflection of the zero frequency Fourier component of the object beam is simply the forward propagating zero frequency Fourier component of the object beam.

Figure 9:
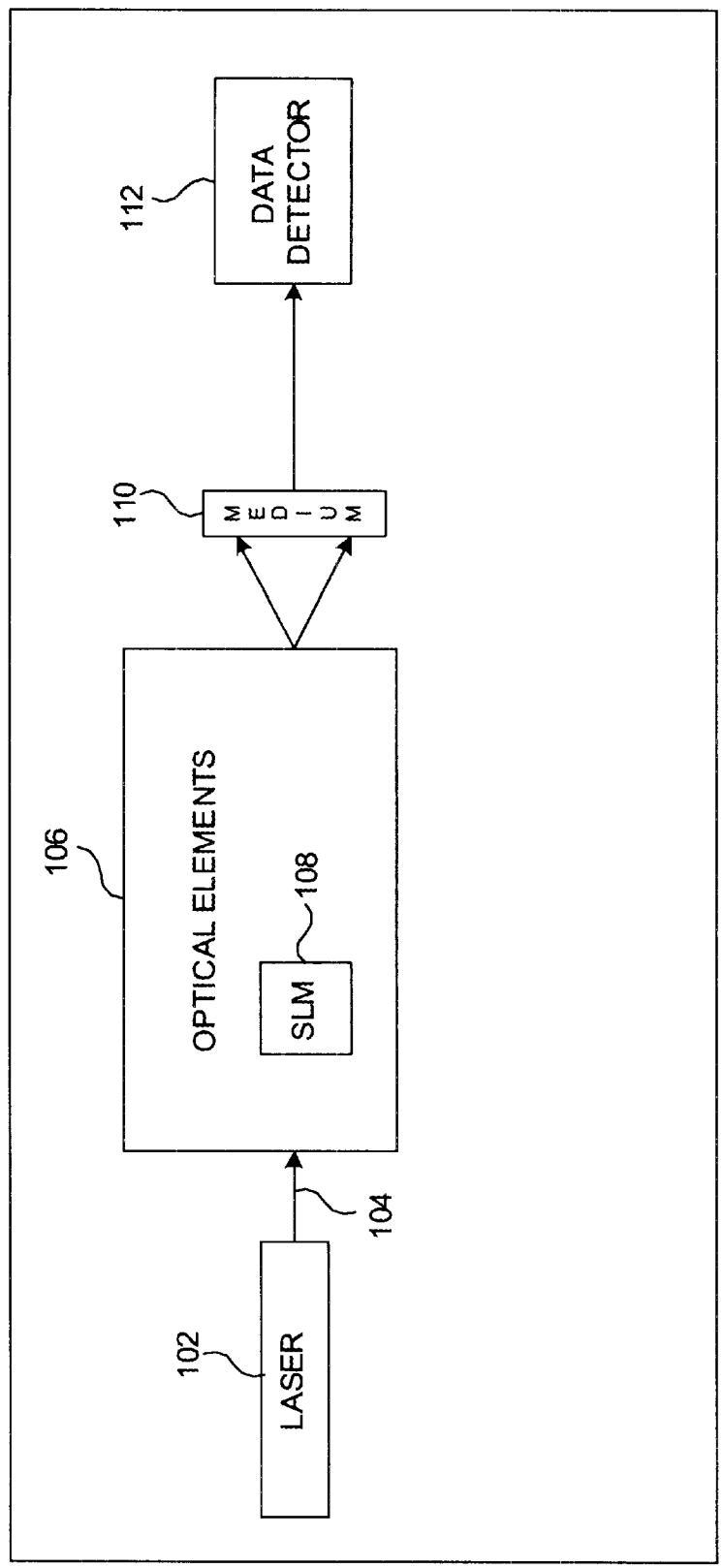
FIGS. 9–10 illustrate systems suitable for implementing self-referenced holographic recording.
Figure 10:
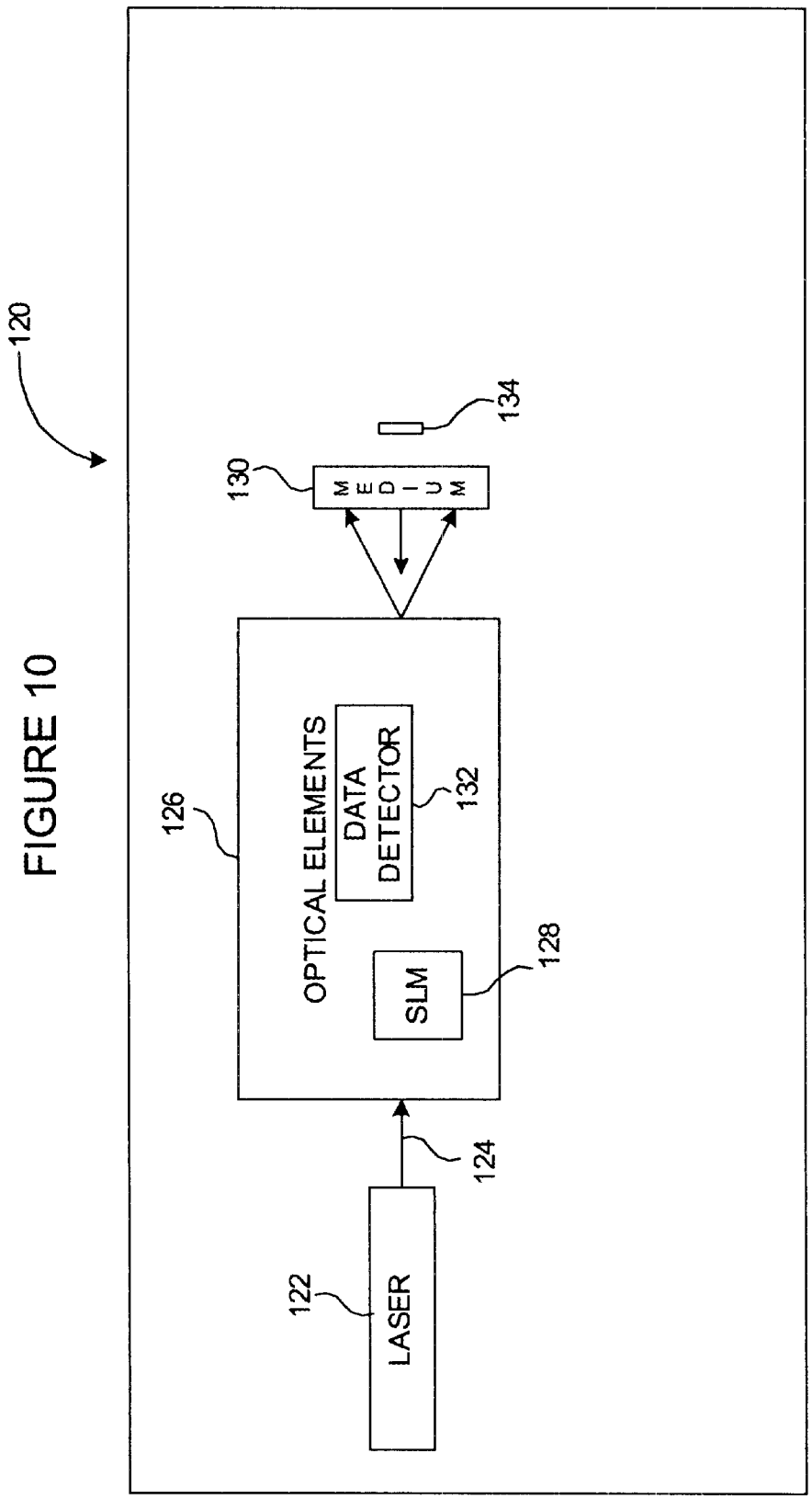

FIGS. 9–10 illustrate systems suitable for implementing self-referencing holography. As shown in FIG. 9, a system 100 includes at least one laser 102 that produces laser light 104. Laser light 104 passes through optical elements 106. For instance, optical elements 106 may include lenses and mirrors. A data encoder, such as SLM 108, may be positioned within the optical elements to encode data in the laser light 104. By way of example, at least some of the optical elements 106 may conform to the optical arrangement shown in FIG. 6, although the scope of the invention is not limited in that respect. Medium 110 is positioned where it can be written with holographic bit maps. Data detector 112, such as a camera, is positioned on the back side of medium 110 to detect data encoded bit maps on medium 110.

As shown in FIG. 10, a system 120 includes at least one laser 122 that produces laser light 124. Laser light 124 passes through optical elements 126. For instance, optical elements 126 may include lenses and mirrors. Mirror 134 may be positioned to optically direct the zero frequency Fourier component of an object beam. A data encoder, such as SLM 128 may be positioned within the optical elements to encode data in the laser light 124. By way of example, at least some of the optical elements 126 and mirror 134 may conform to one of the optical arrangements shown in FIGS. 5A–5C, although the scope of the invention is not limited in that respect. Medium 130 is positioned where it can be written with holographic bit maps. Data detector 132 such as a camera is positioned on the same side of medium 130 as SLM 128 and laser 122. With this configuration, data detector 132 can detect one or more data encoded bit maps that are stored on medium 130.

In the systems shown in FIGS. 9–10, at least one laser 102, 122 may be carried on a record/read head (not shown).

Additional lasers (not shown) may also be carried on the record/read head. Laser 102, 122, for instance, may be properly positioned to read and write holograms on medium 110, 130.

Figure 11:
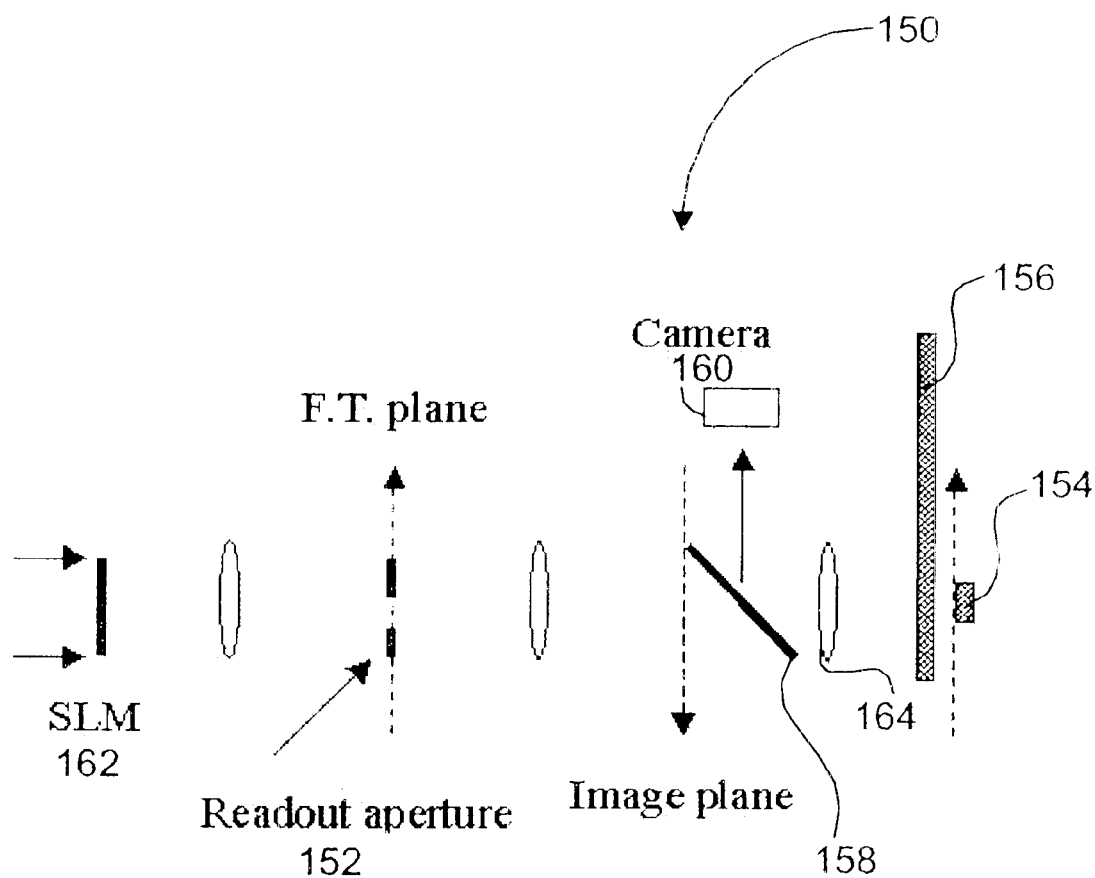
FIGS. 11–14 illustrate the optics of four different exemplary self-referenced holographic recording systems implementing a phase-conjugate readout technique.

FIGS. 11–14 illustrate the optics of four different exemplary self-referencing systems implementing a phase-conjugate readout technique. The systems in FIGS. 11–14 are shown as they might appear during a read phase. As shown in FIG. 11, a system 150 may include a readout aperture 152 that passes only the zero frequency Fourier component of the Fourier spectrum. Mirror 154 that is used during a recording phase remains in place during readout. When the zero frequency Fourier component illuminates medium 156, a reconstructed phase-conjugate of the object beam gets diffracted back towards the original source of the object beam and inverse Fourier transformed by lens 164. Thus, camera 160 can read the reconstructed object beam and detect data encoded in a bit maps that SLM 162 encoded in the object beam during the record phase. Moreover, because light passes through lens 164 to illuminate medium 156 and then passes back through lens 164 before illuminating camera 160, certain aberration inherent in lens 164 may cancel out.

Figure 12:
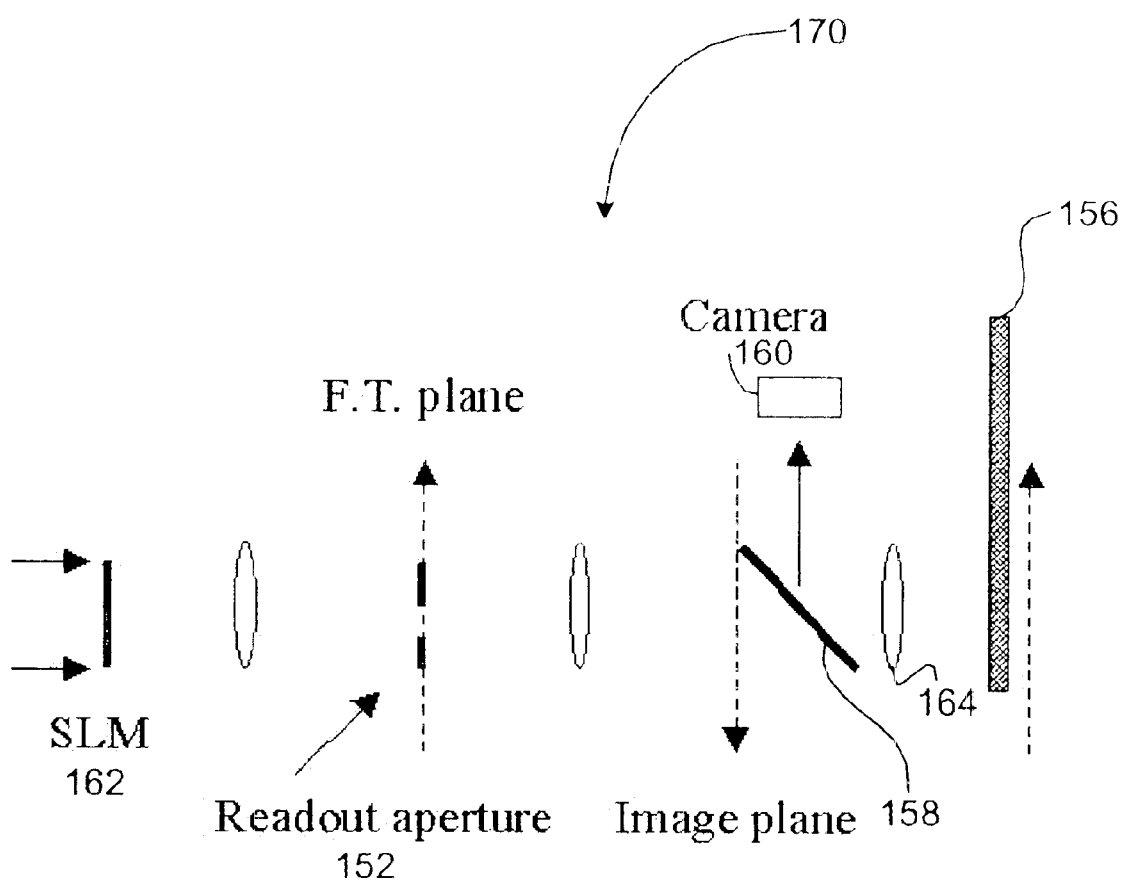

The system 170 shown in FIG. 12 is very similar to the system 150 of FIG. 11. However, in FIG. 12, system 170 removes mirror 154, since it may not be needed during the read phase. Removing mirror 154, for instance, may be advantageous even though doing so could require an additional mechanism and additional "switchover" time for the system to switch from a write configuration to a read configuration.

Figure 13:
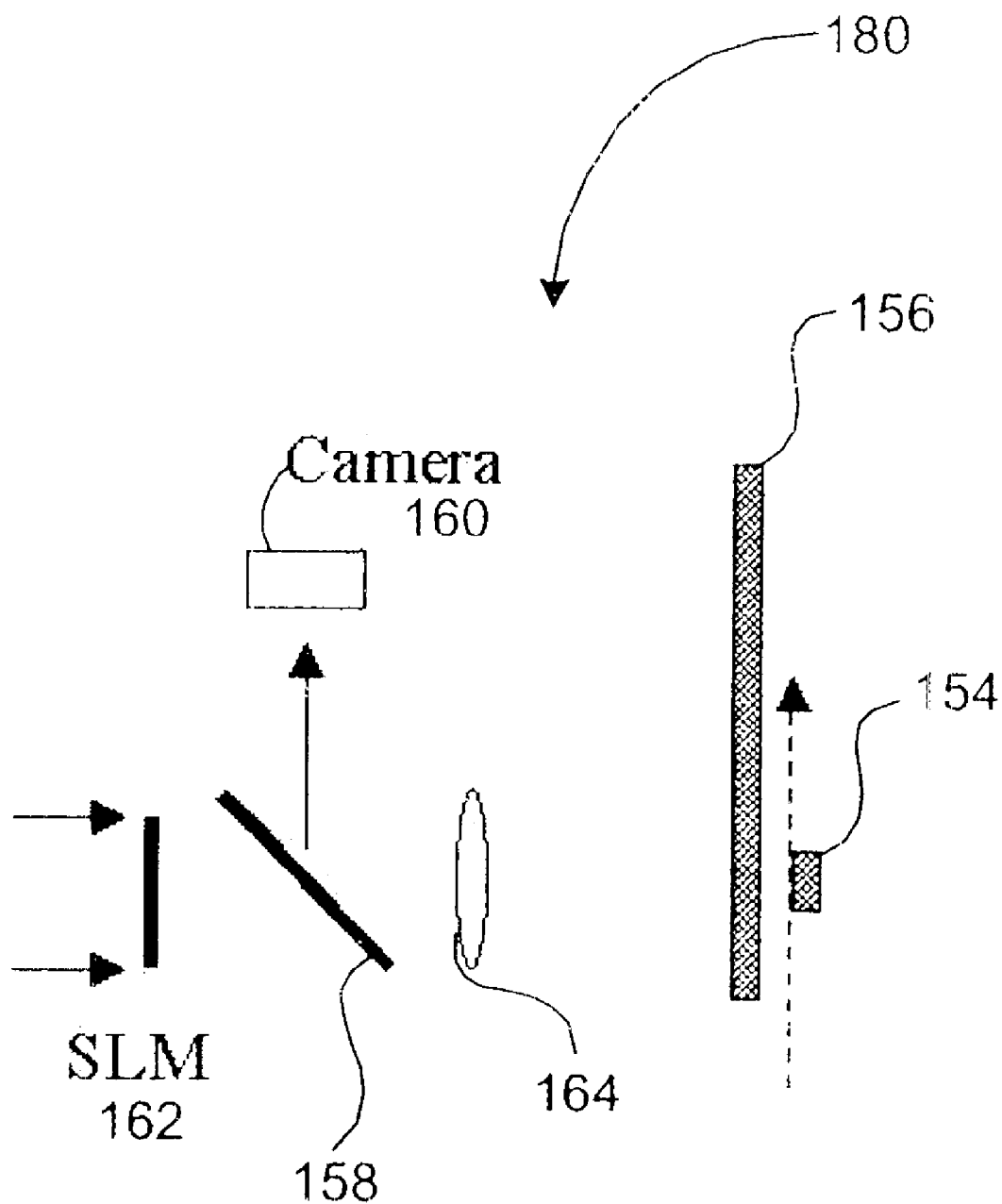
Figure 14:
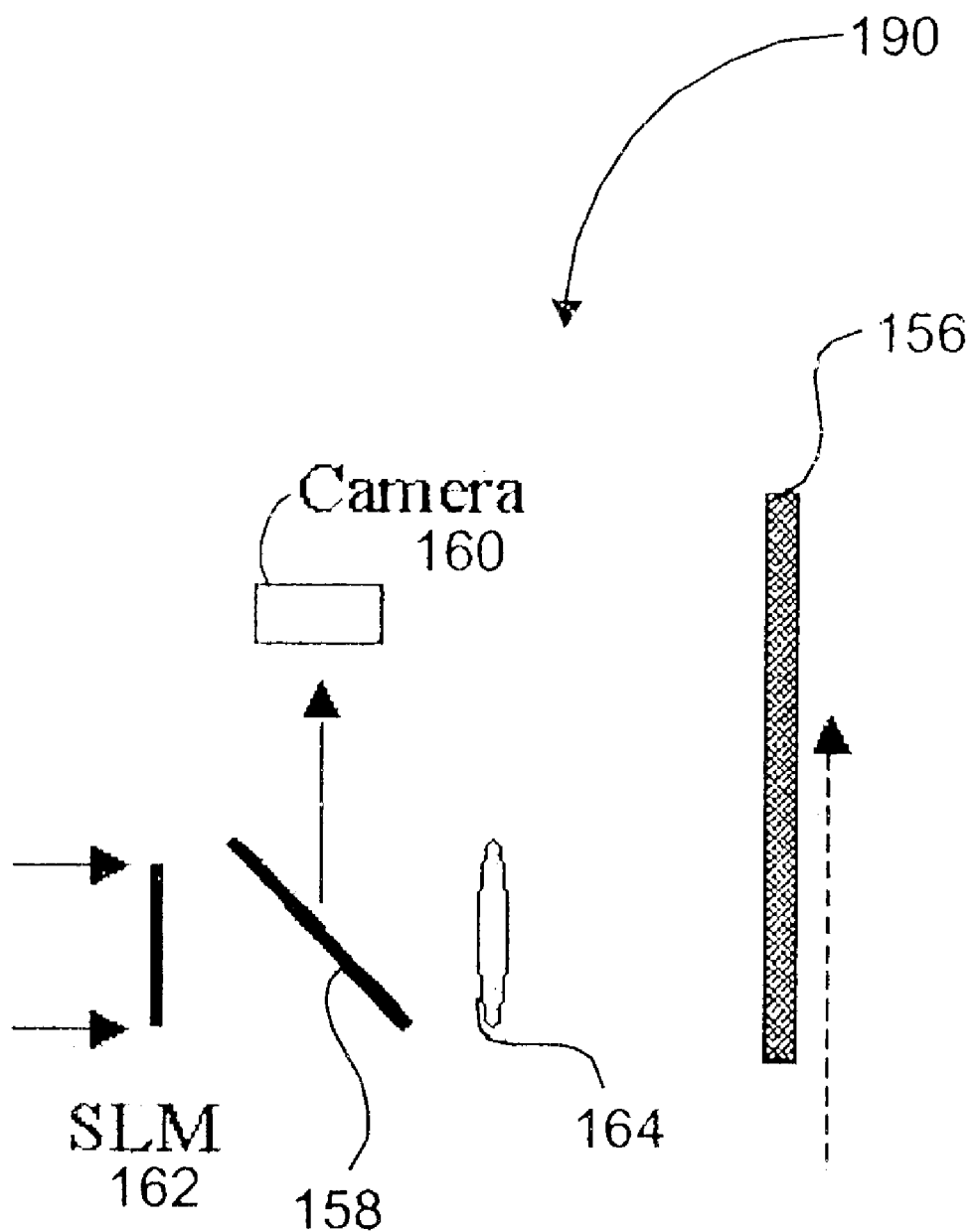

The system 180 shown in FIG. 13 does not include a readout aperture 152 and further reduces the number of optical elements. Mirror 154 that is used during a recording phase remains in place during readout. The system 190 shown in FIG. 14 is very similar to the system 180 of FIG. 13. However, in FIG. 14, system 190 removes mirror 154.

Various embodiments of the invention have been described. For example, self-referenced holographic recording techniques have been described for use with holographic data storage media. Moreover, the techniques may be implemented to realize a holographic data storage system. These and other embodiments are within the scope of the following claims.

What is claimed is:

1. A method of holographic recording comprising:
    illuminating an area of a holographic recording medium with a data encoded first optical beam;
    optically directing only a zero frequency Fourier component of the first optical beam to create a second optical beam; and
    illuminating an area of the medium with the second optical beam.

2. The method of claim 1, wherein the first optical beam and the second optical beam follow coaxial optical paths.

3. The method of claim 1, wherein optically directing only the zero frequency Fourier component of the first optical beam comprises optically directing only the zero frequency Fourier component using a mirror positioned after a media plane to reflect the zero frequency Fourier component of the first optical beam.

4. The method of claim 1, wherein optically directing only the zero frequency Fourier component of the first optical beam comprises optically directing only the zero frequency Fourier component using a lens positioned before a media plane to refract the zero frequency Fourier component of the first optical beam.

5. The method claim 3, wherein optically directing only the zero frequency Fourier component of the first optical beam comprises optically directing only the zero frequency Fourier component using a flat mirror positioned at the center of a Fourier plane.

6. The method of claim 3, wherein optically directing only the zero frequency Fourier component of the first optical beam comprises optically directing only the zero frequency Fourier component using a concave mirror positioned a distance beyond a Fourier plane.

7. The method of claim 3, wherein optically directing only the zero frequency Fourier component of the first optical beam comprises optically directing the only zero frequency Fourier component using a convex mirror positioned a distance before a Fourier plane.

8. A holographic data storage system comprising:

a laser producing laser light;

a collection of optical elements, the optical elements creating an object beam and a reference beam from the laser light, the reference beam being created from only a zero frequency Fourier component of the object beam;

a data encoder for encoding data in the object beam;

a holographic medium containing a hologram created by the interference of the reference beam and object beam; and a data detector for detecting data in the hologram when the hologram is illuminated by the reference beam only.

9. The holographic data storage system of claim 8, wherein the data encoder is a spatial light modulator.

10. The holographic data storage system of claim 8, wherein the data detector includes a camera positioned on an incident side of the medium.

11. The holographic data storage system of claim 8, wherein the collection of optical elements include a mirror positioned after a media plane to reflect only the frequency Fourier component of the object beam to create the reference beam.

12. The holographic data storage system of claim 8, wherein the hologram is generated from an object beam that includes a data encoded bit map.

13. The holographic data storage system of claim 8, wherein the collection of optical elements define an optical path, the object beam and reference beam following the same optical path.

14. The holographic data storage system of claim 13, wherein the optical path is the only optical path in the system.

15. A method comprising:

propagating an object beam and a reference beam along coaxial optical paths;

creating the reference beam from only a zero frequency Fourier component of the object beam; and creating a hologram in a recording medium by interfering the object beam with the reference beam.

16. The method of claim 15, further comprising reading the hologram with a detector positioned on a beam-incident side of the recording medium.

17. The method of claim 15, wherein propagating an object beam and a reference beam along coaxial optical paths comprises propagating an object beam and a reference beam along concentric optical paths.

18. The method of claim 15, further comprising creating the reference beam from only a zero frequency Fourier component of the object beam using a mirror positioned after a media plane to reflect the zero frequency Fourier component of the first optical beam.

19. A method of holographic recording comprising:

illuminating an area of a holographic recording medium with a data encoded first optical beam;

optically directing a zero frequency Fourier component of the first optical beam using a mirror positioned after a media plane to create a second optical beam; and illuminating an area of the medium with the second optical beam.

20. The method of claim 19, wherein the first optical beam and the second optical beam follow coaxial optical paths.

21. The method of claim 19, wherein optically directing the zero frequency Fourier component of the first optical beam comprises optically directing the zero frequency Fourier component using a flat mirror positioned at the center of a Fourier plane.

22. The method of claim 19, wherein optically directing the zero frequency Fourier component of the first optical beam comprises optically directing the zero frequency Fourier component using a concave mirror positioned a distance beyond a Fourier plane.

23. The method of claim 19, wherein optically directing the zero frequency Fourier component of the first optical beam comprises optically directing the zero frequency Fourier component using a convex mirror positioned a distance before a Fourier plane.

* * * * *